United States Patent
Nakajima et al.

(10) Patent No.: US 10,933,616 B2
(45) Date of Patent: Mar. 2, 2021

(54) ROLL PRESS METHOD AND ROLL PRESS SYSTEM

(71) Applicant: SINTOKOGIO, LTD., Nagoya (JP)

(72) Inventors: Shogo Nakajima, Shinshiro (JP); Makio Suzuki, Toyokawa (JP); Akiomi Uchiyama, Toyokawa (JP)

(73) Assignee: SINTOKOGIO, LTD., Nagoya (JP)

( * ) Notice: Subject to any disclaimer, the term of this patent is extended or adjusted under 35 U.S.C. 154(b) by 23 days.

(21) Appl. No.: 16/318,472

(22) PCT Filed: May 26, 2017

(86) PCT No.: PCT/JP2017/019774
§ 371 (c)(1),
(2) Date: Jan. 17, 2019

(87) PCT Pub. No.: WO2018/025476
PCT Pub. Date: Feb. 8, 2018

(65) Prior Publication Data
US 2019/0152210 A1    May 23, 2019

(30) Foreign Application Priority Data
Aug. 1, 2016   (JP) .............................. JP2016-150943

(51) Int. Cl.
*B32B 41/00*   (2006.01)
*B32B 37/00*   (2006.01)
*H01L 51/00*   (2006.01)

(52) U.S. Cl.
CPC ...... *B32B 37/0053* (2013.01); *H01L 51/0024* (2013.01); *B32B 2457/20* (2013.01)

(58) Field of Classification Search
CPC ............ B32B 37/0053; B32B 2457/20; H01L 51/0024; H01L 51/56; B30B 15/26; B30B 3/04; B30B 15/0029; B30B 3/00

(Continued)

(56) References Cited

U.S. PATENT DOCUMENTS

| 6,860,030 B1 * | 3/2005 | Graf | ........................... D21F 3/06 |
| | | | 162/358.3 |
| 2003/0217606 A1 * | 11/2003 | Moore | ..................... G01B 7/14 |
| | | | 73/862.55 |

FOREIGN PATENT DOCUMENTS

| CN | 101239358 A | 8/2008 |
| JP | H10-208568 A | 0/1998 |

(Continued)

OTHER PUBLICATIONS

International Preliminary Report on Patentability dated Feb. 14, 2019 for PCT/JP2017/019774.

*Primary Examiner* — Michael N Orlando
*Assistant Examiner* — Joshel Rivera
(74) *Attorney, Agent, or Firm* — Faegre Drinker Biddle & Reath LLP

(57) ABSTRACT

A roll press method according to an embodiment comprises a roll gap measuring step for measuring a roll gap between an outer peripheral surface of the first roll and an outer peripheral surface of the second roll at one or more positions in a width direction of the first roll while rotating the first roll and the second roll and storing the measured roll gap and rotation angles of the first roll and the second roll in association with each other; and a roll press step for adjusting, according to the rotation angles, a position in the facing direction of the first roll by the adjustment mechanism such that the roll gap is kept within a predetermined variation range with respect to a target value and pressurizing the work by using the first roll in which positions are adjusted in accordance with the rotation angle and the second roll.

12 Claims, 8 Drawing Sheets

(58) Field of Classification Search
USPC .......................... 156/64, 350, 351, 378, 379
See application file for complete search history.

(56) References Cited

FOREIGN PATENT DOCUMENTS

| | | |
|---|---|---|
| JP | S55-33831 A | 3/1980 |
| JP | S55-153606 A | 11/1980 |
| JP | S59-45016 A | 3/1984 |
| JP | S59-191555 A | 10/1984 |
| JP | S63-117204 A | 5/1988 |
| JP | H04-65163 U | 6/1992 |
| JP | H5-317945 | 12/1993 |
| JP | 2000-063909 A | 2/2000 |
| JP | 2007-30337 A | 2/2007 |
| JP | 2007-90396 A | 4/2007 |
| JP | 2013-111647 A | 6/2013 |
| JP | 2014-173996 A | 9/2014 |
| JP | 2016-112872 A | 6/2016 |

* cited by examiner

ROLL PRESS METHOD AND ROLL PRESS SYSTEM

TECHNICAL FIELD

The present disclosure relates to a roll press method and a roll press system.

BACKGROUND ART

As electronic equipment represented by a thin type display and a photovoltaic power generation panel is reduced in size and width, width reduction in an optical film such as a polarizing film and a film member such as a transparent conductive film and a barrier film, which are used in the electronic equipment, are further required. Further, thickness accuracy required in the film member is enhanced as electronic equipment becomes highly functional and precise. These film members generally have a multi-layer structure in which a plurality of film materials is laminated. The film members are formed by using a roll pressure device (roll press) which feeds out each material from a roll raw fabric and laminates by performing heating and pressurizing by two heated rolls. Further, the roll pressure device (roll press) is generally used also in a process to improve a material density by compressing a coated material to obtain a high output characteristic, such as a positive electrode layer and a negative electrode layer used in a lithium-ion battery, a membrane electrode assembly (MEA) and a gas diffusion layer used in a solid polymer fuel cell.

In the roll pressure device, right and left shaft ends of one-side roll of a pair of rolls heated to a desired temperature by a heating means is supported by a bearing, and a roll bearing case storing the bearing is fixed to a main frame. Right and left roll shaft ends of another-side roll is also supported by a bearing, and the roll bearing case can move up and down by being connected to an actuator such as an air cylinder, a hydraulic cylinder, and an electric cylinder. Further, each roll can rotate in a desired by a driving motor. When a movable side roll is pressed to a fixed side roll while adjusting an output of an elevating actuator, a roll is heated to a desired temperature while applying a desired pressurizing force to a multilayered film to be laminated which is flowing between rolls, and the multilayered film is heated and laminated. (For example, see Patent Literature 1)

As the above-described laminating method, a pressurizing force control method and a gap control method are known. The pressurizing force control method detects a load by a load cell provided on right and left sides of a movable side roll and pressurizes at a certain load by controlling each of right and left actuators, and a uniform surface pressure is constantly applied to a workpiece such as a rough multilayered film. The gap control method uniforms a film thickness after laminating treatment by reducing a gap between rolls for a desired distance from a total thickness of a workpiece. (For example, see Patent Literature 2)

For example, in the case where the film thickness accuracy after laminating treatment falls within 10 μm, in a gap control method, a gap between rolls is required to be equal to or less than 10 μm. Examples of factors which affect the gap accuracy include rolling accuracy (circularity, cylindricity, and concentricity), deformation by thermal expansion during roll heating, a self-weight deflection by a both-end support, a deflection by a reaction force during pressurizing, bearing rotation accuracy, roll bearing case assembly accuracy, and a gap and looseness in a vertical direction of a bearing and a driving mechanism.

In a known method as a method to uniformly control a gap between rolls, the roll is heated to a desired temperature, a bearing of a sufficiently thermally expanded movable side roll is pressed at the same load as a load actually applied in laminating treatment by a hydraulic cylinder, and a thermal displacement of the roll and a deflection amount by a reaction force during pressurizing treatment is measured by measuring a roll surface shape while moving a displacement meter provided in vertical and horizontal directions of the roll. Then, a method is proposed in which, based on this deflection amount, a correction amount of the roll is determined by a calculator, and the roll is forcibly deformed by a correction means. (For example, see Patent Literature 3)

CITATION LIST

Patent Literature

Patent Literature 1: Japanese Unexamined Patent Publication No. 2007-30337
Patent Literature 2: Japanese Unexamined Patent Publication No. 2013-111647
Patent Literature 3: Japanese Unexamined Patent Publication No. 2014-173996

SUMMARY OF INVENTION

Technical Problem

However, the correction method described in Japanese Unexamined Patent Publication No. 2014-173996, a roll shape is measured in a state in which rolling is stopped. Therefore, although a roll shape at a certain position can be measured, it is difficult to measure a shape of the entire roll periphery. Gap accuracy is significantly affected by factors such as rolling accuracy and bearing rotation accuracy. However, in the method described in Japanese Unexamined Patent Publication No. 2014-173996, when a roll is rotating, a deflection amount cannot be measured and corrected. Therefore, it is difficult to precisely control a roll gap. In the case where the roll gap is not precisely controlled, uniformity of the thickness of a pressurized work may be reduced.

Therefore, a roll press method and a roll press system are required which can precisely measure a gap over the entire roll periphery and improve uniformity of the thickness of the work.

Solution to Problem

To achieve the above-described object, in an embodiment, a roll press method using a roll pressure device which continuously pressurizes a work is provided. The roll pressure device includes a first roll and a second roll facing each other, and an adjustment mechanism capable of adjusting a position of the first roll along a facing direction of the first roll and the second roll. The roll press method comprising: a roll gap measuring step for measuring a roll gap between an outer peripheral surface of the first roll and an outer peripheral surface of the second roll at one or more positions in a width direction of the first roll while rotating the first roll and the second roll and storing the measured roll gap and rotation angles of the first roll and the second roll in association with each other; and a roll press step for adjusting, according to the rotation angles, a position in the facing direction of the first roll by the adjustment mechanism such that the roll gap is kept within a predetermined variation range with respect to a target value and pressurizing the work by using the first roll in which positions are adjusted in accordance with the rotation angle and the second roll.

In the method according to the above-described embodiment, a roll gap between an outer peripheral surface of the first roll and an outer peripheral surface of the second roll is measured while rotating the first roll and the second roll. Therefore, a roll gap of the entire periphery, which fully reflects the influence of factors such as rolling accuracy, bearing rotation accuracy, and bearing assembling accuracy, and a roll thermal deformation, which affect roll gap accuracy in an actual pressurizing treatment, can be accurately measured in a short time. Then, a work is pressurized while adjusting a position in a facing direction of the first roll according to a rotation angle such that the roll gap falls within a predetermined variation range with respect to a target value. Therefore, uniformity of the thickness of the work after pressurizing treatment can be enhanced.

In an embodiment, in a roll gap measuring step, a roll gap may be measured at positions corresponding to both ends in a width direction of a work.

In a method according to the embodiment, the roll gap is measured at positions corresponding to the both ends in a width direction of the work, and therefore a difference between roll gaps at two different positions can be measured. Then, based on the measured roll gaps in two different positions, a position in a facing direction of a first roll is adjusted according to a rotation angle. Therefore, uniformity of the thickness of the pressurized work can be enhanced.

In an embodiment, the adjustment mechanism is capable of individually adjusting positions of one end and another end of a rotation axis of the first roll along a direction in parallel with the facing direction. The roll gap measuring step includes a first step for measuring the roll gap at a first position in a width direction of the first roll and adjusting a position of the one end based on the roll gap measured at the first position, the first position being closer to the one end than the other end, a second step for measuring the roll gap at a second position in a width direction of the first roll after the first step and adjusting a position of the other end based on the roll gap measured at the second position, the second position being closer to the other end than the one end, and a third step for alternately and repeatedly performing the first step and the second step such that the roll gaps at the first position and the second position fall within a predetermined variation range with respect to a target value.

In the method according to the embodiment, by alternately and repeatedly performing the first step and the second step, an adjustment amount of the adjustment mechanism can be converged such that roll gaps at the first position and the second position fall within a predetermined variation range with respect to a target value.

In an embodiment, the adjustment mechanism is capable of individually adjusting positions of one end and another end of a rotation axis of the first roll along a direction in parallel with the facing direction. The roll gap measuring step includes a first step for measuring the roll gaps at a first position and at a second position in a width direction of the first roll at the same time, the first position being closer to the one end than the other end, the second position being closer to the other end than the one end, a second step for adjusting a position of the one end based on the roll gap at the first position and adjusting a position of the other end based on the roll gap at the second position, and a third step for alternately and repeatedly performing the first step and the second step such that the roll gaps at the first position and the second position fall within a predetermined variation range with respect to a target value.

In the method according to the embodiment, the roll gaps are measured at the first position and the second position at the same time. Therefore, a time to adjust a position of the first roll can be shortened.

In an embodiment, in the roll gap measuring step, the roll gap is measured by using a roll gap measuring device. The roll gap measuring device includes a light projecting side measuring sensor configured to irradiate a light to a gap between the first roll and the second roll, and a light receiving side measuring sensor configured to receive a light passing the gap and detect a width of the received light, and in the roll gap measuring step, the roll gap is measured from the light width detected by the light receiving side measuring sensor.

According to the embodiment, the roll gap can be continuously and accurately measured by measuring the roll gap from the width of the light passing the gap between the first roll and the second roll.

In an embodiment, the roll press method may further comprise a thickness measuring step for measuring a thickness of the work before and/or after pressurizing treatment.

According to the embodiment, it can be confirmed whether the thickness of the work is a target thickness by measuring the thickness of the work before and/or after pressurizing treatment that. Further, for example, the measured thickness of the work can be fed back to a roll gap. Therefore the works can be bonded together, thickness quality can be enhanced, and roll gap accuracy can be adjusted in a short time.

In another embodiment, a roll press system including a roll pressure device and a roll gap measuring device is provided. The roll pressure device includes a first roll and a second roll facing each other, an adjustment mechanism capable of adjusting a position of the first roll along a facing direction of the first roll and the second roll, and a control device. The roll gap measuring device is capable of measuring a roll gap between an outer peripheral surface of the first roll and an outer peripheral surface of the second roll at one or more positions in a width direction of the first roll while rotating the first roll and the second roll. The control device includes a storage unit configured to store the roll gap measured by the roll gap measuring device and rotation angles of the first roll and the second roll in association with each other, and a position control unit configured to adjust, according to the rotation angle, a position in the facing direction of the first roll by the adjustment mechanism such that the roll gap falls within a predetermined variation range with respect to a target value.

In the roll press system according to the embodiment, as in the above-described roll press method, uniformity of the thickness of a work after pressurizing treatment can be enhanced.

In an embodiment, an adjustment mechanism may use an electrically-operated servo actuator.

As in the embodiment, by using the electrically-operated servo actuator as an adjustment mechanism, a position and an attitude of a first roll can be precisely controlled.

In an embodiment, the adjustment mechanism is capable of individually adjusting positions of one end and another end of a rotation axis of the first roll along a direction in parallel with the facing direction.

In the embodiment, positions of the one end and the other end of the rotation axis of the first roll can be individually adjusted. Therefore, a position and an attitude of the first roll in the facing direction (inclination in a width direction of the first roll) can be adjusted.

In an embodiment, the control device performs first control for controlling the adjustment mechanism is controlled such that a position of the one end is adjusted based on the roll gap at a first position in a width direction of the first roll measured by the roll gap measuring device, the first position being closer to the one end than the other end; second control for controlling the adjustment mechanism is controlled such that a position of the other end is adjusted based on the roll gap at a second position in a width direction of the first roll measured by the roll gap measuring device, the second position being closer to the other end than the one end; and third control for performing the first control and the second control alternately and repeatedly such that the roll gaps at the first position and the second position fall within a predetermined variation range with respect to a target value.

In the embodiment, by alternately and repeatedly performing the first control and the second control, an adjustment amount of the adjustment mechanism can be converged such that roll gaps at the first position and the second position fall within a predetermined variation range with respect to a target value.

In an embodiment, the control device performs first control for receiving the roll gaps at the first position and the second position in a width direction of the first roll measured by the roll gap measuring device at the same time from the roll gap measuring device, the first position being closer to the one end than the other end, the second position being closer to the other end than the one end; second control for controlling the adjustment mechanism such that a position of the one end is adjusted based on the roll gap at the first position, and a position of the other end is adjusted based on the roll gap at the second position; and third control for performing the first control and the second control alternately and repeatedly such that the roll gaps at the first position and the second position fall within a predetermined variation range with respect to a target value.

In the embodiment, the roll gaps are measured at the first position and the second position at the same time. Therefore, a time to adjust a position of the first roll can be shortened.

In an embodiment, a first roll and a second roll may be rotationally driven by a servo motor.

As in the embodiment, when the first roll and the second roll are rotationally driven by the servo motor, a rotation angle of each roll can be measured with a roll gap. Therefore, a relation between a roll gap and a rotation angle can be accurately measured.

In an embodiment, a thickness measuring device which measures the thickness of a work before and/or after pressurizing treatment may further include.

According to the embodiment, it can be confirmed by measuring the thickness of the work before and/or after the pressurizing treatment that the thickness of the work comes to a target thickness. Further, for example, the thickness of the measured work can be fed back to a roll gap. Therefore the works can be bonded together, thickness quality can be enhanced, and roll gap accuracy can be adjusted in a short time.

Advantageous Effects of Invention

According to an embodiment and various embodiments of the present invention, uniformity of the thickness of a treated work can be enhanced.

BRIEF DESCRIPTION OF DRAWINGS

FIG. 6(A) is a table illustrating a relation between a rotation angle of an upper roll and a position of a lower end of a peripheral surface of the upper roll; FIG. 6(B) is a table illustrating a relation between a rotation angle of a lower roll and a position of an upper end of a peripheral surface of the lower roll; FIG. 6(C) is a table illustrating a relation between a rotation angle of each roll and a roll gap;

DESCRIPTION OF EMBODIMENTS

Hereinafter, a roll press system according to an embodiment described herein will be described with reference to the drawings.

Figure 1:
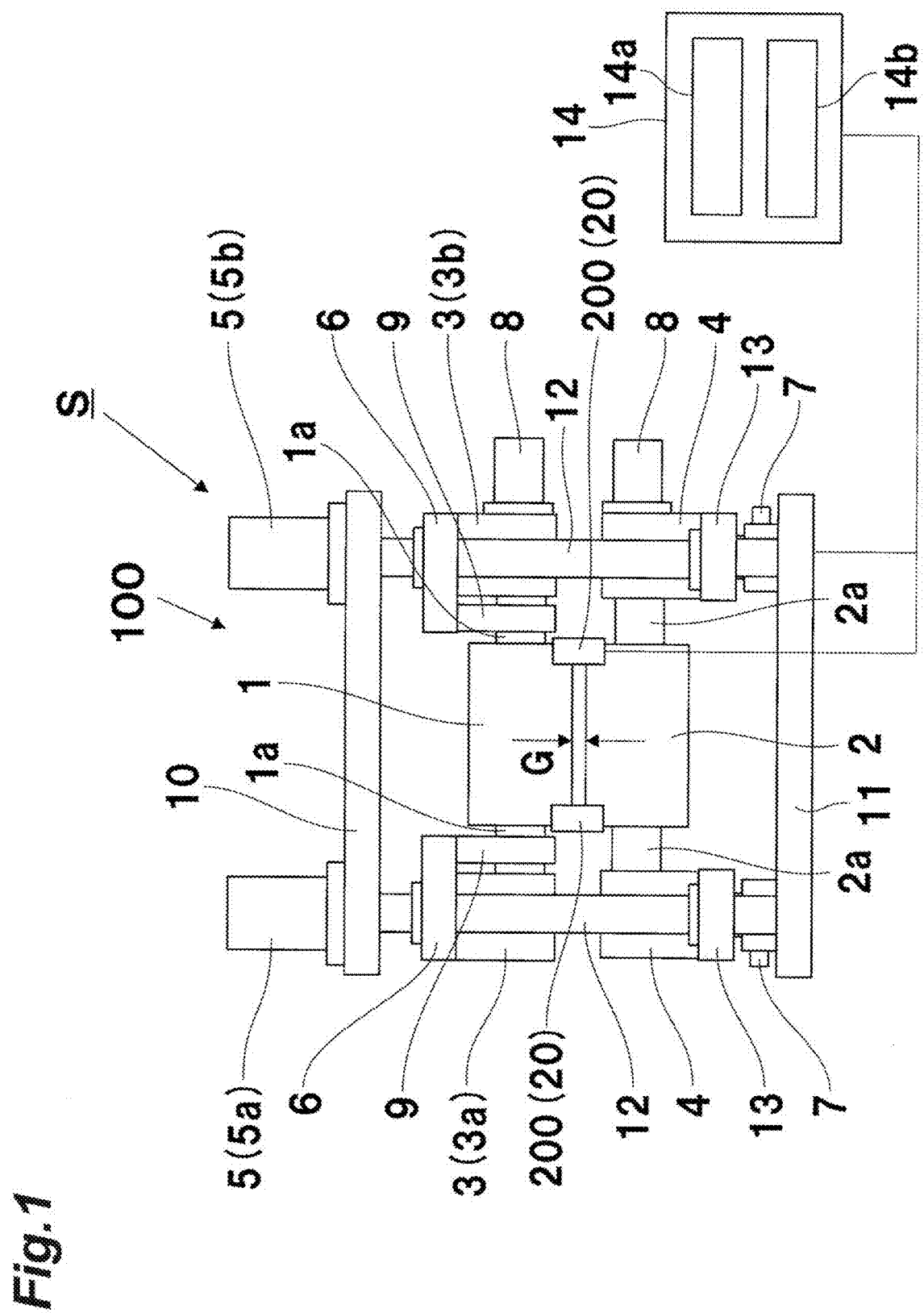
FIG. 1 is an elevation view schematically illustrating a roll press system according to an embodiment.
Figure 2:
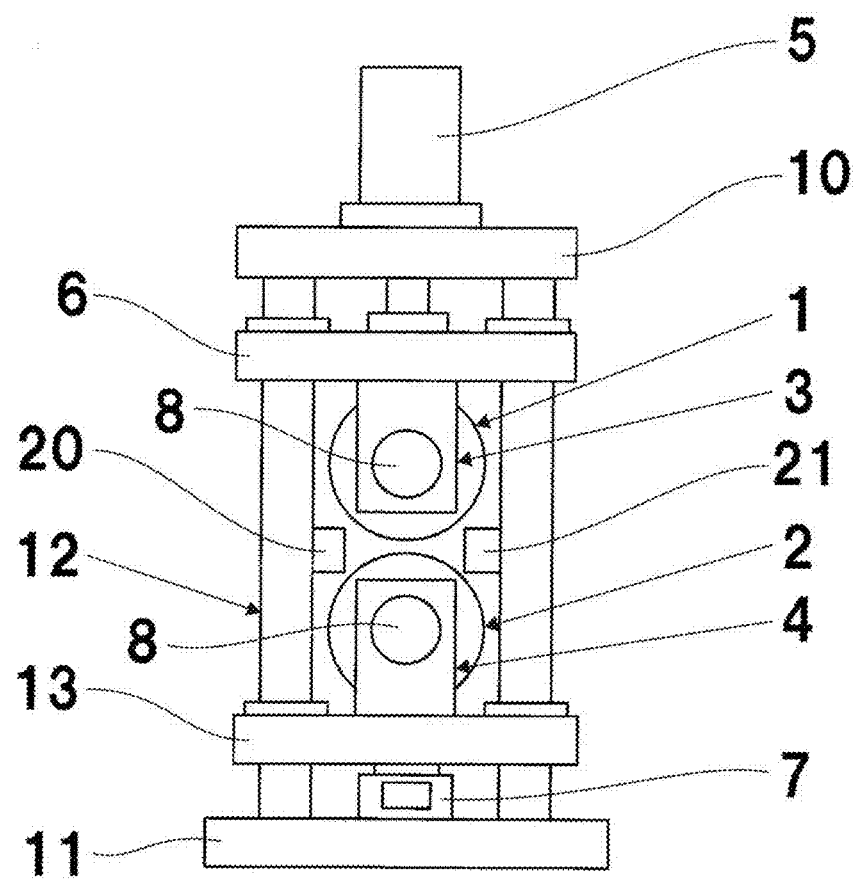
FIG. 2 is a side view of the roll press system.
Figure 3:
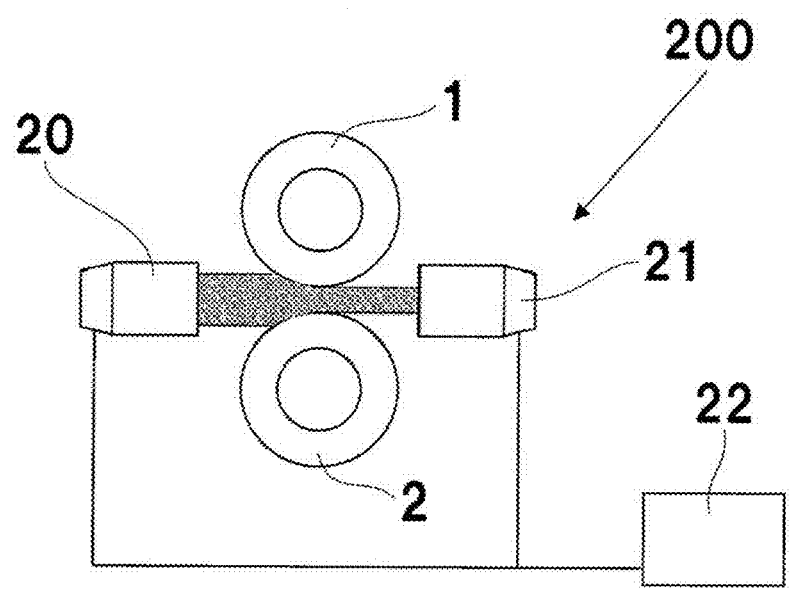
FIG. 3 is a view schematically illustrating a configuration of a roll gap measuring device.

As illustrated in FIGS. 1 to 3, a roll press system S includes a roll pressure device 100 and a roll gap measuring device 200. In FIG. 1, the roll press system S includes two roll gap measuring devices 200. However, the roll press system S may include one roll gap measuring device.

The roll pressure device 100 includes an upper roll (first roll) 1 and a lower roll (second roll) 2 which are a pair of pressure rolls to pressurize a work. The upper roll 1 and the lower roll 2 are disposed so as to face each other with a gap. The upper roll 1 and the lower roll 2 are disposed between an upper frame 10 and a lower frame 11 connected via longitudinally and laterally disposed four tie rods 12.

The upper roll 1 and the lower roll 2 are formed in a columnar shape, and an upper roll shaft 1a and a lower roll shaft 2a are formed at each of both ends as a rotation axis.

The upper roll 1 and the lower roll 2 are disposed in a vertical direction such that the upper roll shaft 1a and the lower roll shaft 2a are substantially in parallel with each other. A gap including a predetermined roll gap G is formed between an outer peripheral surface of the upper roll 1 and an outer peripheral surface of the lower roll 2. Pressurizing treatment is performed to a work when the work passes through the gap.

In the embodiment, the upper roll 1 and the lower roll 2 include a known roll heating means (not illustrated) such as a circulation mechanism of an electric heater and a high temperature liquid medium. As a result, pressurizing treatment can be performed while heating the work.

The upper roll shaft 1a of the upper roll 1 can be held by a pair of upper roll bearing cases 3 provided on an outer side in a width direction of the upper roll 1. A bearing is incorporated into the upper roll bearing case 3 and rotatably supports both ends of the upper roll shaft 1a. A pair of the upper roll bearing cases 3 can include a first upper roll bearing case 3a and a second upper roll bearing case 3b. The first upper roll bearing case holds one end E1 (refer to FIG. 5) out of both ends of the upper roll shaft 1a. The second upper roll bearing case holds another end E2 out of both ends of the upper roll shaft 1a.

The lower roll shaft 2a of the lower roll 2 can be held by a pair of lower roll bearing cases 4 provided on an outer side in a width direction of the lower roll 2. A bearing is incorporated into the lower roll bearing cases 4 and rotatably supports the lower roll shaft 2a.

A rotation servo motor 8 to rotationally drive the upper roll 1 and the lower roll 2 is connected to each of the upper roll shaft 1a of the upper roll 1 and the lower roll shaft 2a of the lower roll 2.

Each of the upper roll bearing cases 3 is connected to a pair of electrically-operated servo actuators 5 via a pair of upper movable frames 6 in which ball screws (not illustrated) are incorporated. The electrically-operated servo actuator 5 is disposed at an upper portion of the upper frame 10. A pair of the electrically-operated servo actuators 5 can include a first electrically-operated servo actuator 5a and a second electrically-operated servo actuator 5b.

The electrically-operated servo actuator 5 can control a position of a pair of the upper roll bearing cases 3 independently on right and left sides in accordance with a control command from a control device 14 to be described later.

The upper roll bearing case 3 can vertically move along the tie rod 12 via the upper movable frame 6. The upper roll bearing case 3 applies a load to the upper roll 1, generates a press load with respect to a work (belt-like material) between the upper roll 1 and the lower roll 2, and controls a position and an attitude of the upper roll 1. Consequently, the upper roll bearing case 3 can adjust a roll gap G. In other words, the electrically-operated servo actuator 5 and the upper movable frame 6 form an adjustment mechanism which independently adjusts a vertical position of a pair of the upper roll bearing cases 3 during rotation of the upper roll 1. Specifically, the first electrically-operated servo actuator 5a transmits, to the first upper roll bearing case 3a, a driving force which vertically moves the first upper roll bearing case 3a via the upper movable frame 6. Further, the second electrically-operated servo actuator 5b transmits, to the second upper roll bearing case 3b, a driving force which vertically moves the second upper roll bearing case 3b via the upper movable frame 6. As described above, by adjusting vertical positions of the first upper roll bearing case 3a and the second upper roll bearing case 3b, vertical positions of the one end E1 and the other end E2 of the upper roll shaft 1a are adjusted. The electrically-operated servo actuator 5 can adjust a position of the upper roll 1 along a facing direction of the upper roll 1 and the lower roll 2 by adjusting vertical positions of the one end E1 and the other end E2 of the upper roll shaft 1a.

In the lower roll bearing case 4, a position can be determined by vertically moving the lower roll bearing case 4 along the tie rod 12 via a lower movable frame 13.

In the embodiment, a load cell 7 is provided which detects a reaction force in pressurizing treatment from a roll to the lower movable frame 13.

The upper movable frame 6 includes a known means 9 for canceling self-weight drop of upper-roll including a mechanism to energize a bearing and a sliding bearing upward to prevent that the roll gap G expands since the upper roll 1 is lifted by a reaction force by roll pressing.

The roll press system S further includes the control device 14. The control device 14 is a computer including a processor, a storage unit, and an input device, and a display device and controls each unit of the roll press system S. This control device 14 controls each unit of the roll pressure device 100 and the roll gap measuring device 200 in accordance with an operation condition stored in the storage unit for pressurizing treatment of the work.

The control device 14 includes a calculation/storage unit 14a and a position control unit 14b. The calculation/storage unit 14a calculates a roll gap G based on data sent from the roll gap measuring device 200 to be described later, and the calculated roll gap G and rotation angles of the upper roll 1 and the lower roll 2 are stored in association with each other. The position control unit 14b adjusts positions of a pair of the upper roll bearing cases 3 by controlling an adjustment mechanism in accordance with an operation condition set based on the relation between the roll gap G and the rotation angles stored in the calculation/storage unit 14a.

The roll press system S further includes the roll gap measuring device 200. The roll gap measuring device 200 detects the roll gap G between an outer peripheral surface of the upper roll 1 and an outer peripheral surface of the lower roll 2. The roll gap measuring device 200, for example, measures displacement amounts at a lower end of a peripheral surface of the upper roll 1 and an upper end of a peripheral surface of the lower roll 2 when the upper roll 1 and the lower roll 2 rotate, and detects the roll gap G from the measured displacement amounts. The roll gap measuring device 200 includes a light projecting side measuring sensor 20, a light receiving side measuring sensor 21, and an amplifier 22.

An example of the roll gap measuring device 200 will be described with reference to FIG. 3. As indicated in FIG. 3, the light projecting side measuring sensor 20 and the light receiving side measuring sensor 21 are disposed on an upstream side and a downstream side of a conveyance direction of a work so as to face each other across a gap formed between the upper roll 1 and the lower roll 2. The light projecting side measuring sensor 20 emits, as a measuring light source, a laser light or a LED light having a width of approximately 0.1 to 0.5 mm to the light receiving side measuring sensor 21. In the measuring light source irradiated from the light projecting side measuring sensor 20, the upper roll 1 and the lower roll 2 become a light shielding body, and a light corresponding to a space between the rolls passes through, and the light is received by the light receiving side measuring sensor 21. Here, a top of the passing belt-like light is positioned at a lower end of a peripheral surface of the upper roll 1, and a bottom if the light corresponds to an upper end position of a peripheral surface of the lower roll. The light receiving side measuring sensor 21 is a measuring sensor which can measure two position data at the submicron level and send the measured data to the control device 14 via the amplifier 22. By forming the roll gap measuring device 200 as described above, the roll gap G can be continuously measured from the measured positions of a lower end of a peripheral surface of the upper roll 1 and an upper end of a peripheral surface of the lower roll 2 at the same time. In the case where the amplifier 22 includes a calculation function, the roll gap G calculated by the amplifier 22 can be sent to the control device 14.

Hereinafter, a roll press method according to an embodiment will be described with reference to FIG. 4. Each process in the roll press method indicated in FIG. 4 is performed by controlling the electrically-operated servo actuator 5, the rotation servo motor 8, and the roll gap measuring device 200 by the control device 14.

Figure 4:
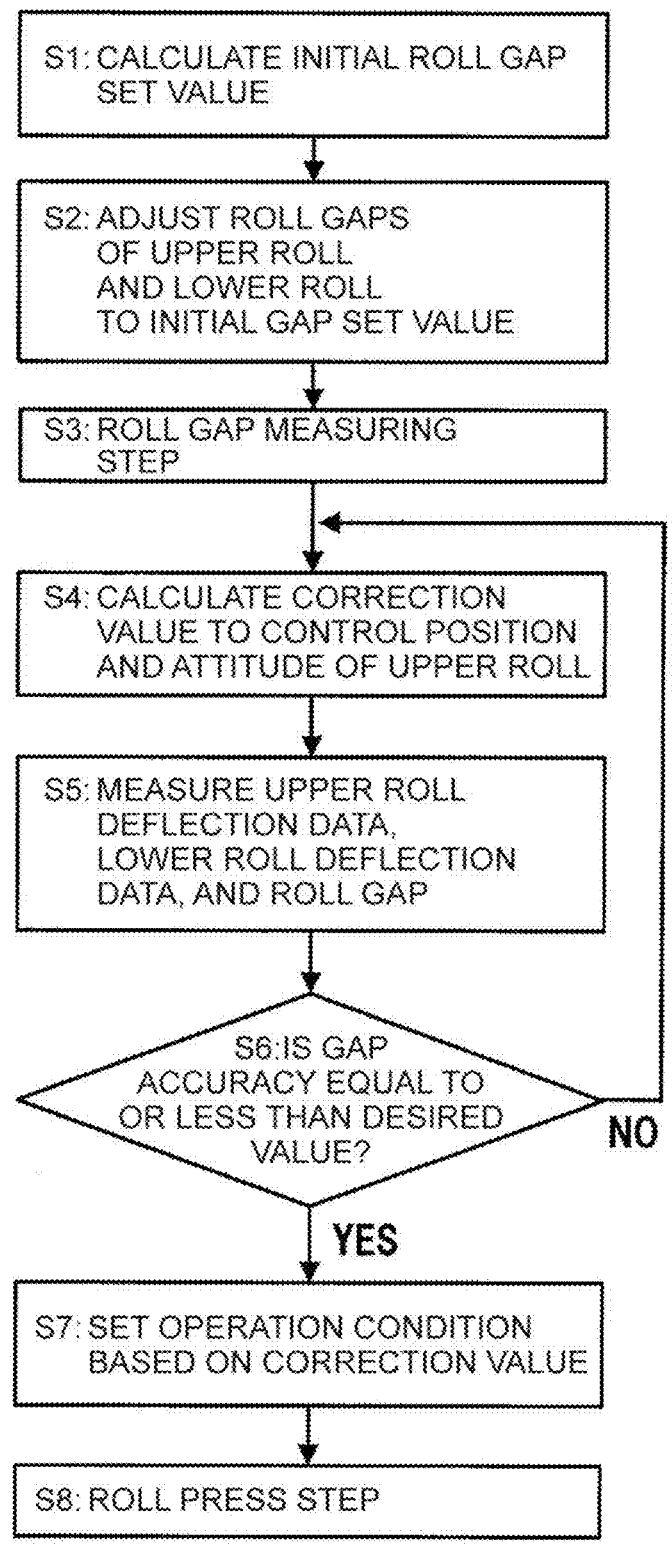
FIG. 4 is a flowchart indicating a roll press method according to an embodiment.

As indicated in FIG. 4, first, in step S1, such that a work has a predetermined thickness after pressurizing treatment, a push-in amount of the upper roll 1, a roll heating temperature, and a conveyance speed of the work are determined. An initial gap set value is calculated from a reference thickness of the work with respective to the push-in amount of the upper roll 1.

In the following step S2, by a heating means (not illustrated), the upper roll 1 and the lower roll 2 are heated to a desired temperature, and in a state in which thermal expansion of the upper roll 1 and the lower roll 2 is stable, the roll gap G in a gap formed between a peripheral surface of the upper roll 1 and a peripheral surface of the lower roll 2 is adjusted to the initial gap set value. This state is set to a reference state, and a rotation angle is set to 0°.

The following step S3 is a roll gap measuring process to measure the roll gap G. In step S3, the rotation servo motor 8 is controlled by the control device 14, and the upper roll 1 and the lower roll 2 are rotationally driven at the same rotation speed. Then, in a state in which the upper roll 1 and the lower roll 2 are rotating, a displacement of a lower end of a peripheral surface of the upper roll 1 and a displacement of an upper end of a peripheral surface of the lower roll 2 are measured by the roll gap measuring device 200. The measured displacement data is sent to the calculation/storage unit 14a of the control device 14, the roll gap G is calculated in the calculation/storage unit 14a, and the roll gap G is stored in association with rotation angles of the upper roll 1 and the lower roll 2. Here, measurement intervals of data of the roll gap G are desirably set in consideration of a rotation speed, and at least data per rotation angle of 1° is preferably acquired. Here, the upper roll 1 and the lower roll 2 are driven by a servo motor. Therefore, a rotation angle can be measured with the roll gap G, and a relation between the roll gap G and the rotation angle can be accurately measured.

Figure 5:
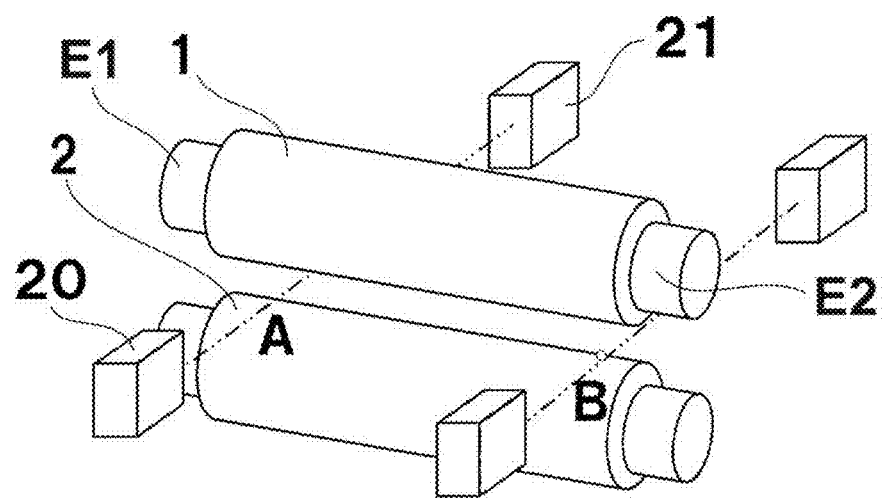
FIG. 5 is a view describing positions to measure a roll gap by the roll gap measuring device.

FIG. 5 schematically indicates an example of a method to measure a displacement according to rotation angles of a lower end of a peripheral surface of the upper roll 1 and an upper end of a peripheral surface of the lower roll 2 and measure the roll gap G As illustrated in FIG. 5, the light projecting side measuring sensor 20 and the light receiving side measuring sensor 21 of the roll gap measuring device 200 are disposed so as to measure the roll gaps G at a position A (first position) and a position B (second position) each corresponding to both ends of the work. This position A is closer to the one end E1 than the other end E2 of the upper roll shaft 1a. This position B is closer to the other end E2 than the one end E1 of the upper roll shaft 1a. As described above, by measuring the roll gaps G at the positions A and B, a target thickness of a work after pressurizing treatment can be reflected at a pressurizing position of the work. Therefore, measurement accuracy can be enhanced.

Figure 6:
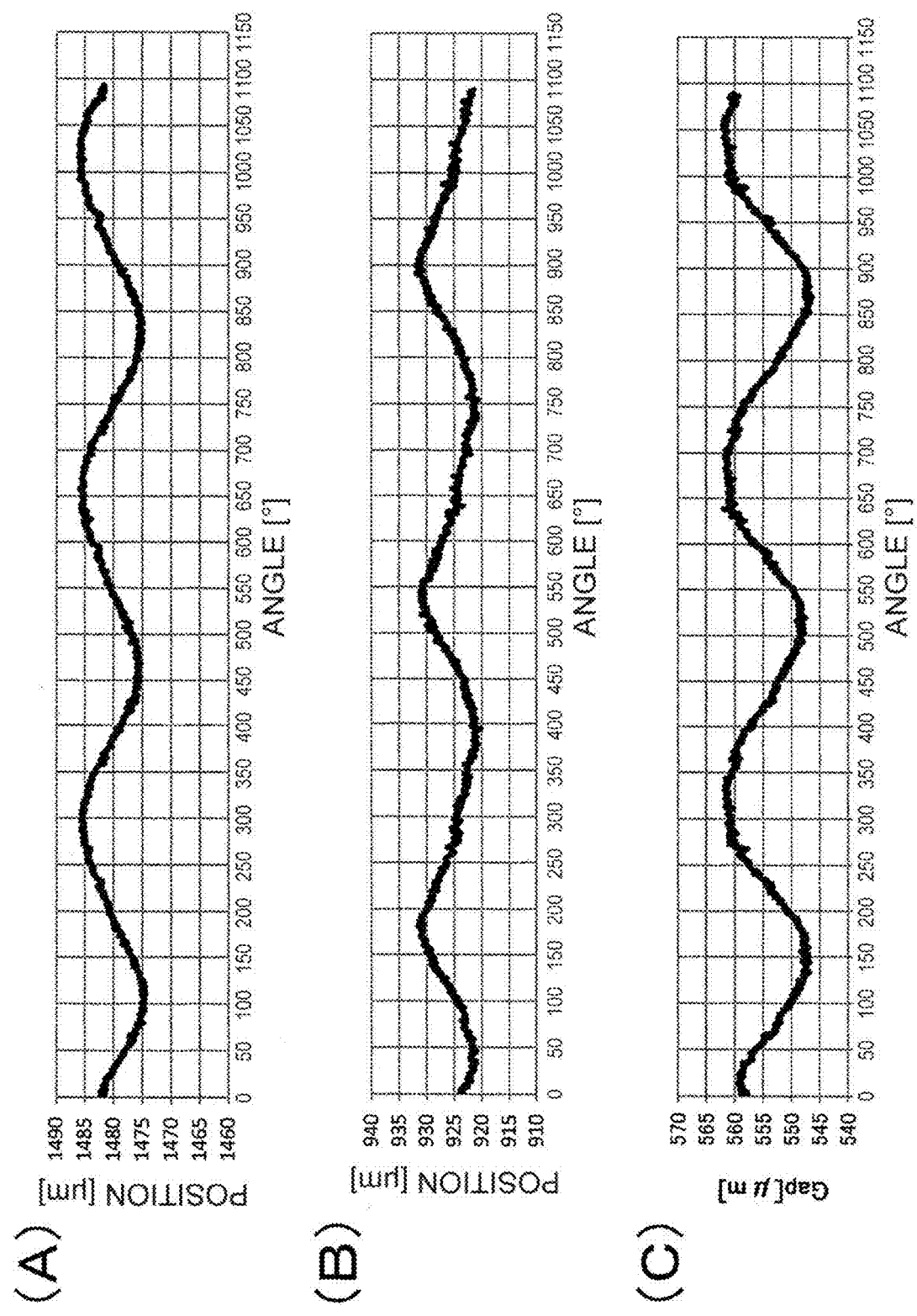
FIG. 6 is tables indicating a relation between measured roll gaps and rotation angles.

FIG. 6 indicates an example (the position A) of a relation between the roll gap G and the rotation angles measured in step S3. FIG. 6(A) indicates a relation (hereinafter called upper roll deflection data) between a rotation angle of the upper roll 1 and a position of a lower end of a peripheral surface of the upper roll 1. FIG. 6(B) indicates a relation (hereinafter called lower roll deflection data) between a rotation angle of the lower roll 2 and a position of an upper end of a peripheral surface of the lower roll 2. FIG. 6(C) indicates a relation between a rotation angle of each roll and the roll gap G. The roll gap G is calculated as a value obtained by subtracting a displacement of a lower end of a peripheral surface of the upper roll 1 from a displacement of an upper end of a peripheral surface of the lower roll 2. Here, "position" on vertical axes of FIGS. 6(A) and 6(B) indicates a distance from a reference point set in the roll gap measuring device 200. Further, the upper roll deflection data, the lower roll deflection data, and the roll gap G are data of three roll rotations (at 0° to 1080°).

Measurement conditions in the measurement example indicated in FIG. 6 will be described below.

Roll diameter: 150 mm
Roll width: 180 mm
Measurement position: 15 mm from a roll end.
Roll rotation speed: 2.67 rpm
Data acquisition interval: per 1°
Target roll gap: 554 μm The upper roll deflection data and the lower roll deflection data change in accordance with rotation angles, and the same waveform is repeated for one rotation cycle (360° cycle). A target value of the roll gap G is 554 μm. However, the roll gap G fluctuates between 547 to 562 μm including the target value. Therefore, variation range indicating gap accuracy becomes 15 μm which is a large value. In step S3, a similar measurement is performed at the position B.

In the following step S4, positions of the one end E1 and the other end E2 of the upper roll shaft 1a are individually adjusted from the roll gap G according to the rotation angles measured in step S3, and a correction value to control a position and an attitude of the upper roll 1 according to a rotation angle is calculated. Specifically, in step S4, two correction values are calculated which includes a correction value to control a position of the first upper roll bearing case 3a and a correction value to control a position of the second upper roll bearing case 3b.

These correction values are calculated such that the roll gap G falls within a predetermined variation range with respect to a target value. For example, these correction values are calculated by adjusting, by the position control unit 14b of the control device 14, a position of the upper roll bearing case 3 according to a rotation angle in one rotation of the upper roll 1 so as to reduce a difference between fluctuation values of the upper roll deflection data and the lower roll deflection data. Here, a correction value is calculated based on the roll gap G in which a distance coefficient is measured. The distance coefficient is set in consideration of a geometrical relation of such as measurement data of the positions A and B, a distance from the positions A and B to the upper roll bearing case 3, and a roll diameter. Here, an interval to calculate a correction value is preferably, at least, equal to or greater than 360 points per 1°. A detailed calculation method of a correction value in step S4 will be described later.

In the following step S5, based on a correction value obtained in step S4, the electrically-operated servo actuator 5 is driven to individually control positions of a pair of the upper roll bearing cases 3, and the roll gap G is measured while controlling a position and an attitude of the upper roll 1 according to a rotation angle.

Figure 7:
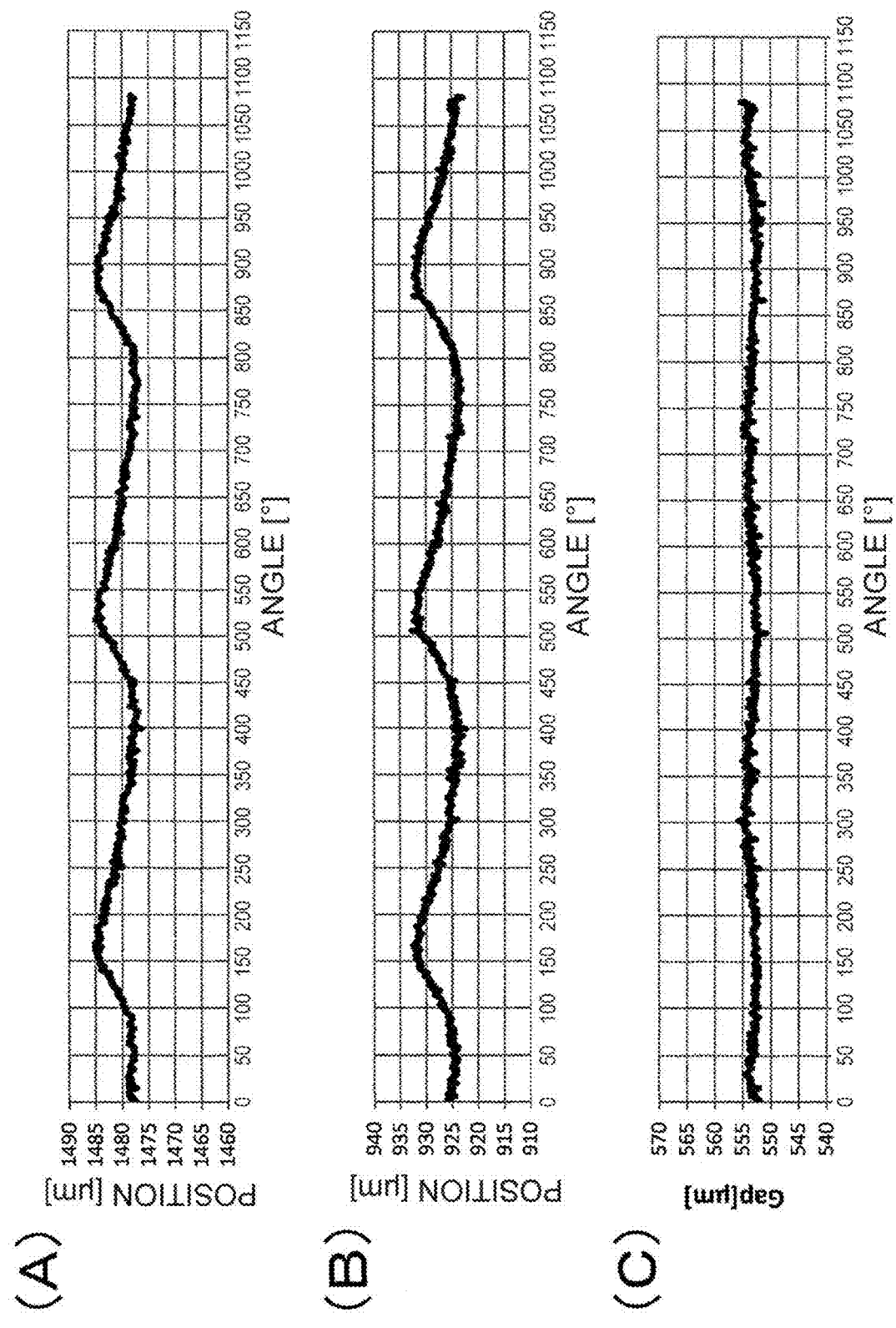
FIG. 7(A) is a table indicating deflection data of an upper roll after a position and an attitude of the upper roll are adjusted.
FIG. 7(B) is a table indicating deflection data of a lower roll after a position and an attitude of the upper roll are adjusted.
FIG. 7(C) is a table indicating a roll gap after a position and an attitude of the upper roll are adjusted.

FIG. 7 indicates upper roll deflection data (FIG. 7(A)), lower roll deflection data (FIG. 7(B)), and the roll gap G (FIG. 7(C)) when a position and an attitude of the upper roll 1 are corrected, and the data and the roll gap G are measured at the same positions as in FIG. 6.

The upper roll deflection data follows the lower roll deflection data according to a rotation angle. As indicated in FIG. 7(C), a target value is 554 μm, and the roll gap G fluctuates between 553 to 555 μm including the target value. Therefore, a variation range is 2 μm which is a significantly small. From this result, it is confirmed that gap accuracy of the roll gap G is significantly enhanced by adjusting a position of the upper roll bearing case 3.

FIG. 4 is described again. In the following step S6, it is determined whether the gap accuracy is equal to or less than a desired value. When the gap accuracy is equal to or less than the desired value (step S6: YES), step S7 is performed. When the gap accuracy is higher than the desired value (step S6: NO), step S4 is performed, and steps S4 and S5 are repeatedly performed such that the gap accuracy becomes equal to or less than the desired value. The gap accuracy may be determined by gap accuracy of a roll central portion in addition to the positions A and B.

In the following step S7, an operation condition is set based on a correction value. The operation condition includes a control amount in accordance with rotation angles of the first electrically-operated servo actuator 5a and the second electrically-operated servo actuator 5b to set the position after adjusting vertical positions of the one end E1 and the other end E2.

The above-described steps S4 to S7 correspond to a roll gap correction step in which the operation condition to control such that the roll gap G falls within a predetermined variation range with respect to a target value.

Here, the correction value in step S4 can be set in the following procedures. First, the roll gap G is measured at the position A, and a position of the first upper roll bearing case 3a closer to the position A is adjusted based on the measured roll gap G (the first step, and the first control). As a result, a position in a vertical direction of the one end E1 of the upper roll shaft 1a is adjusted based on a roll gap at the position A. Next, a roll gap is measured at the position B, and a position of the second upper roll bearing case 3b closer to the position B is adjusted based on the measured roll gap G (the second step, and the second control). As a result, a vertical direction of the other end E2 of the upper roll shaft 1a is adjusted based on the roll gap G at the position B. Next, these steps are repeatedly performed so as to obtain an operation condition to obtain a desired roll gap. That is, the steps are repeatedly performed such that the roll gaps G measured at the positions A and B fall within a predetermined variation range with respect to a target value (the third step, and the third control). As a result, a satisfactory correction value and operation condition can be obtained. These steps can be performed by controlling an adjustment mechanism by the control device 14.

When two pairs of the light projecting side measuring sensors 20 and the light receiving side measuring sensors 21 are included, the correction value in step S4 can be determined in the following procedures. First, the roll gaps G are measured at the positions A and B at the same time (the first step, and the first control). Then, a position of the first upper roll bearing case 3a is adjusted based on the roll gap G measured at the position A. Further, the second upper roll bearing case 3b closer to the position B based on the roll gap G measured at the position B is adjusted (the second step, and the second control). As a result, each vertical position of the one end E1 and the other end E2 of the upper roll shaft 1a is adjusted based on roll gaps at the positions A and B. Then, the roll gaps G are measured again at the positions A and B. These steps are repeatedly performed so as to obtain an operation condition to obtain a desired roll gap and such that the roll gaps G measured at the positions A and B fall within a predetermined variation range with respect to a target value (the third step, and the third control). As a result, a satisfactory correction value and operation condition can be obtained. In this manner, the roll gaps at the positions A and B are measured at the same time, and therefore a time to determine a correction value can be shortened.

In the following step S8, based on the operation conditions set in step S7, positions of a pair of the upper roll bearing cases 3 are individually adjusted, and pressurizing treatment is performed to a work by using the upper roll 1 and the lower roll 2 in which positions and attitudes are adjusted in accordance with rotation angles.

In the above-described steps, the correction value fully reflecting the influence of factors such as rolling accuracy, bearing rotation accuracy, bearing assembly accuracy, and a roll thermal deformation, which affect roll gap accuracy in an actual pressurizing treatment is require with accuracy and in a short time over the entire roll periphery, and an operation condition can be set based on the correction value. Therefore, the thickness of a pressurized work can be uniformed.

(Variations)

Roll press methods and roll press systems according to various embodiments have been described above. However, the embodiments can be variously varied within a range not changing the gist of the present invention without being limited to the above-described embodiments. For example, in an embodiment, one roll gap measuring device 200 may measure roll gaps G at plural positions. Further, the roll gap measuring device 200 can be prepared in which two pairs of light projecting side measuring sensors 20 and light receiving side measuring sensors 21 are included, and measure roll gaps at two positions at the same time. Further, a plurality of the roll gap measuring devices 200 may be prepared. Furthermore, the roll gap measuring device 200 may be disposed in a roll pressure device 100 and may be disposed only when measuring the roll gap G.

In the embodiments, an optical sensor is used as the roll gap measuring device 200. However, the optical sensor may not be necessarily used. For example, the roll gap measuring device 200 may include, as a sensor to measure a roll gap, the other sensor such as a capacitance type displacement sensor, an eddy current type displacement sensor, and a mechanical displacement sensor. Further, although the roll gap G is calculated as a value obtained by subtracting a displacement value of an upper end of a peripheral surface of the lower roll 2 from a displacement of a lower end of a peripheral surface of the upper roll 1, the roll gap G may be directly measured.

In the embodiment, pressure rolls are vertically disposed. However, the pressure rolls may not be necessarily vertically disposed. For example, the rolls may be horizontally disposed in parallel. Further, although a position and an attitude of the upper roll 1 are controlled, a position and an attitude of the lower roll 2 may be controlled.

Further, in the roll press method indicated in FIG. 5, the roll gap G is measured at the two positions A and B in a width direction of the upper roll 1. However, the roll gaps G is not necessarily measured at a plurality of positions and can be measured at one or more positions.

Further, in the embodiment, positions of a pair of the upper roll bearing cases 3 are individually adjusted by an adjustment mechanism. However, a target to adjust a position by the adjustment mechanism is not limited to a pair of the upper roll bearing cases 3 as long as a position along a vertical direction of the upper roll 1 can be adjusted.

(Effects of Embodiments)

According to the roll press method and the roll press system according to the above-described embodiments, a reference position is set to each of the upper roll 1 and the lower roll 2. In the roll gap measuring step, roll gaps G are measured at two positions in a width direction of the roll while rotating the upper roll 1 and the lower roll 2. A relation between rotation angles from a reference position and the roll gap G is obtained at least for one roll rotation. In the roll gap correction step, a position of the upper roll bearing case 3 is controlled in accordance with rotation angles based on a relation between the rotation angle from the reference position and the roll gap G. An operation condition to control such that the roll gap G falls within a predetermined variation range with respect to a target value of the roll gap G is determined. In the roll press step, based on the operation condition, pressurizing treatment is performed to a work. As a result, a correction value fully reflecting the influence of factors such as rolling accuracy, bearing rotation accuracy, bearing assembly accuracy, and a roll thermal deformation, which affect accuracy of the roll gap G in an actual pressurizing treatment is required with accuracy and in a short time over the entire roll periphery, and an operation condition can be set based on the correction value. Therefore, the thickness of a pressurized work can be uniformed. Especially, the roll press method/system is preferably used in pressurizing treatment in a laminating step of a multi-layered functional film and a compression process of a battery material.

Other Embodiments

A roll press system S may include a thickness measuring device to measure the thickness of a work to be treated.

Figure 8:
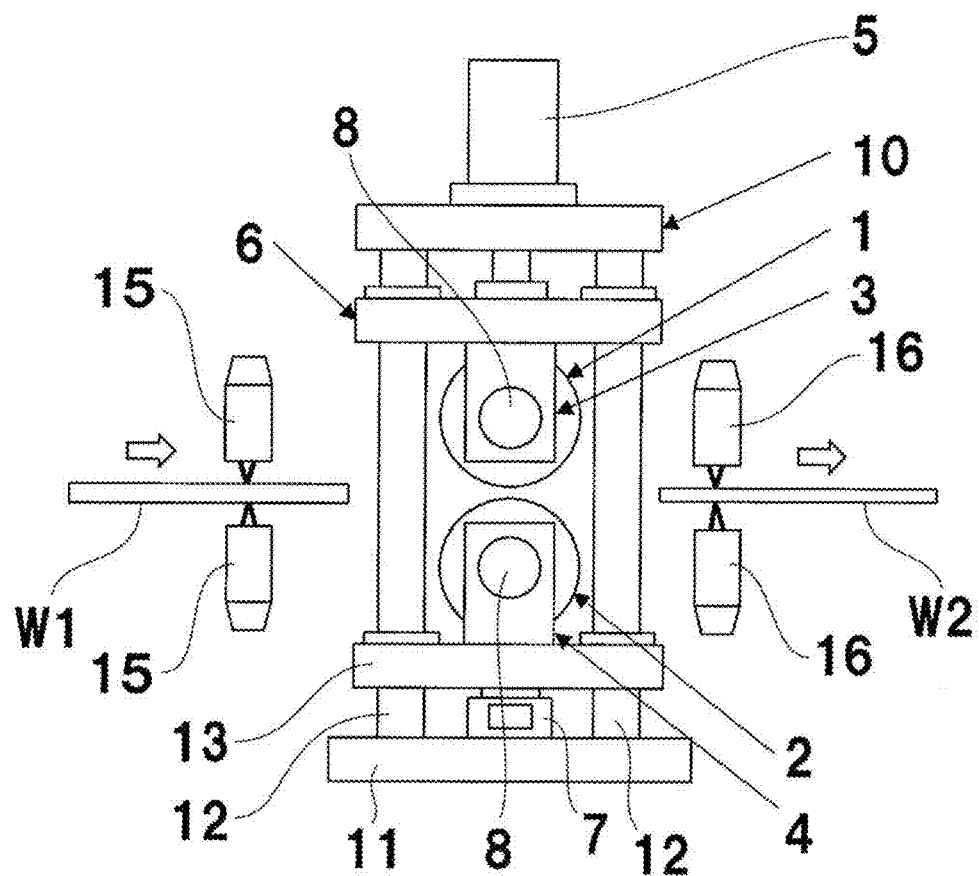
FIG. 8 is a side view illustrating a roll press system according to the other embodiment.

FIG. 8 is a side view schematically illustrating a roll press system according to the other embodiment. As illustrated in FIG. 8, this roll press system includes a first thickness measuring device 15 and a second thickness measuring device 16. The first thickness measuring device 15 is provided on an upstream side in a conveyance direction of a work in the roll pressure device 100. The second thickness measuring device 16 is provided on a downstream side in a conveyance direction of a work in the roll pressure device 100. As the first thickness measuring device 15 and the second thickness measuring device 16, a known sensor having desired measurement accuracy can be used. In the embodiment, a reflection type displacement gauge using a laser light as a light source is used. In this type of the first thickness measuring device 15, a master workpiece of which thickness has been previously measured is measured by vertically disposed first thickness measuring device 15 at the same time. When the thickness of a work is measured, a difference from data of the measured work piece is calculated, and the thickness is calculated.

A work before pressurizing treatment is denoted by W1, and a work after the pressurizing treatment is denoted by W2. In the embodiment, the first thickness measuring device 15 measures the thickness of W1, and sends the measured data to a control device 14. The control device 14 adds a necessary push-in amount to the measured thickness and calculates a target value of the roll gap G. By a conveyance mechanism using a servo motor (not illustrated), a distance from the roll pressure device 100 to W1 is measured, and at a timing when pressurizing treatment is performed to W1 between the upper roll 1 and the lower roll 2, the height of the upper roll 1 can be adjusted in accordance with the measured thickness. As a result, when a work is pressed to a specified thickness, the work can be constantly pressed by a same amount. As a result, a pressure is uniformly applied regardless of the thickness of a work to be pressurized.

In the case where the thickness of W2 is uniformed, the second thickness measuring device 16 measures the thickness of W2, and measurement data is sent to the control device 14. When a set thickness and a measured thickness differ, the control device 14 calculates a correction value considering the difference and controls by reflecting the re-correction value from the next treatment of W1. As a result, the work can be pressurized so that the thickness of the work after pressurizing treatment becomes a set thickness.

As described above, when the roll press system S includes a thickness measuring device, the thickness of a work to be treated is measured and can be fed back to an operation condition. Therefore, the works can be bonded together, thickness quality can be enhanced, and roll gap accuracy can be adjusted in a short time.

REFERENCE SIGNS LIST

1 . . . upper roll, 1a . . . upper roll shaft, 2 . . . lower roll, 2a . . . lower roll shaft, 3 . . . upper roll bearing case, 4 . . . lower roll bearing case, 5 . . . electrically-operated servo actuator, 6 . . . upper movable frame, 7 . . . load cell, 8 . . . rotation servo motor, 9 . . . means for canceling self-weight drop of upper-roll, 10 . . . upper frame, 11 . . . lower frame, 12 . . . tie rod, 13 . . . lower movable frame, 14 . . . control device, 14a . . . calculation/storage unit, 14b . . . position control unit, 15 . . . first thickness measuring device, 16 . . . second thickness measuring device, 20 . . . light projecting side measuring sensor, 21 . . . light receiving side measuring sensor, 100 . . . roll pressure device, 200 . . . roll gap measuring device, S . . . roll press system, W1 . . . work before pressurizing treatment, W2 . . . work after pressurizing treatment.

The invention claimed is:

1. A roll press method using a roll pressure device which continuously pressurizes a work,
   wherein the roll pressure device includes
   a first roll and a second roll facing each other, and
   an adjustment mechanism capable of adjusting a position of the first roll along a facing direction of the first roll and the second roll, and
   the roll press method comprising:
   a roll gap measuring step for measuring a roll gap between an outer peripheral surface of the first roll and an outer peripheral surface of the second roll at one or more positions in a width direction of the first roll while rotating the first roll and the second roll, and storing the measured roll gap and rotation angles of the first roll and the second roll in association with each other; and
   a roll press step for adjusting, according to the rotation angles, a position in the facing direction of the first roll by the adjustment mechanism such that the roll gap is kept within a predetermined variation range with respect to a target value and pressurizing the work by using the first roll in which positions are adjusted in accordance with the rotation angle and the second roll,
   wherein, in the roll gap measuring step, the roll gap is measured by using a roll gap measuring device,
   wherein the roll gap measuring device includes
   a light projecting side measuring sensor configured to irradiate a light to a gap between the first roll and the second roll, and
   a light receiving side measuring sensor configured to receive a light passing the gap and detect a width of the received light, and
   in the roll gap measuring step, the roll gap is measured from the light width detected by the light receiving side measuring sensor.

2. The roll press method according to claim 1, wherein, in the roll gap measuring step, the roll gap is measured at positions corresponding to both ends in a width direction of the work.

3. The roll press method according to claim 1, wherein the adjustment mechanism is capable of individually adjusting positions of one end and another end of a rotation axis of the first roll along a direction in parallel with the facing direction,
- the roll gap measuring step includes
- a first step for measuring the roll gap at a first position in a width direction of the first roll and adjusting a position of the one end based on the roll gap measured at the first position, the first position being closer to the one end than the other end,
- a second step for measuring the roll gap at a second position in a width direction of the first roll after the first step and adjusting a position of the other end based on the roll gap measured at the second position, the second position being closer to the other end than the one end, and
- a third step for alternately and repeatedly performing the first step and the second step such that the roll gaps at the first position and the second position fall within a predetermined variation range with respect to a target value.

4. The roll press method according to claim 1, wherein the adjustment mechanism is capable of individually adjusting positions of one end and another end of a rotation axis of the first roll along a direction in parallel with the facing direction,
- the roll gap measuring step includes
- a first step for measuring the roll gaps at a first position and at a second position in a width direction of the first roll at the same time, the first position being closer to the one end than the other end, the second position being closer to the other end than the one end,
- a second step for adjusting a position of the one end based on the roll gap at the first position and adjusting a position of the other end based on the roll gap at the second position, and
- a third step for alternately and repeatedly performing the first step and the second step such that the roll gaps at the first position and the second position fall within a predetermined variation range with respect to a target value.

5. The roll press method according to claim 1, further comprising:
- a thickness measuring step for measuring a thickness of the work before and/or after pressurizing treatment.

6. A roll press system comprising a roll pressure device and a roll gap measuring device,
- wherein the roll pressure device includes
- a first roll and a second roll facing each other,
- an adjustment mechanism capable of adjusting a position of the first roll along a facing direction of the first roll and the second roll, and
- a control device,
- the roll gap measuring device includes a light projecting side measuring sensor configured to irradiate a light to a gap between the first roll and the second roll and a light receiving side measuring sensor configured to receive a light passing the gap and detect a width of the received light, and is capable of measuring a roll gap between an outer peripheral surface of the first roll and an outer peripheral surface of the second roll from the light width detected by the light receiving side measuring sensor at one or more positions in a width direction of the first roll while rotating the first roll and the second roll,
- the control device includes
- a storage unit configured to store the roll gap measured by the roll gap measuring device and rotation angles of the first roll and the second roll in association with each other, and
- a position control unit configured to adjust, according to the rotation angle, a position in the facing direction of the first roll by the adjustment mechanism such that the roll gap falls within a predetermined variation range with respect to a target value.

7. The roll press system according to claim 6, wherein the adjustment mechanism includes an electrically-operated servo actuator.

8. The roll press system according to claim 6, wherein the adjustment mechanism is capable of individually adjusting positions of one end and another end of a rotation axis of the first roll along a direction in parallel with the facing direction.

9. The roll press system according to claim 8, wherein the control device performs:
- first control for controlling the adjustment mechanism is controlled such that a position of the one end is adjusted based on the roll gap at a first position in a width direction of the first roll measured by the roll gap measuring device, the first position being closer to the one end than the other end;
- second control for controlling the adjustment mechanism is controlled such that a position of the other end is adjusted based on the roll gap at a second position in a width direction of the first roll measured by the roll gap measuring device, the second position being closer to the other end than the one end; and
- third control for performing the first control and the second control alternately and repeatedly such that the roll gaps at the first position and the second position fall within a predetermined variation range with respect to a target value.

10. The roll press system according to claim 8, wherein the control device performs:
- first control for receiving the roll gaps at the first position and the second position in a width direction of the first roll measured by the roll gap measuring device at the same time from the roll gap measuring device, the first position being closer to the one end than the other end, the second position being closer to the other end than the one end;
- second control for controlling the adjustment mechanism such that a position of the one end is adjusted based on the roll gap at the first position, and a position of the other end is adjusted based on the roll gap at the second position; and
- third control for performing the first control and the second control alternately and repeatedly such that the roll gaps at the first position and the second position fall within a predetermined variation range with respect to a target value.

11. The roll press system according to claim 6, wherein the first roll and the second roll are rotationally driven by a servo motor.

12. The roll press system according to claim 6, further comprising:
- a thickness measuring device configured to measure the thickness of a work before and/or after pressurizing treatment.

* * * * *